(12) United States Patent
Sforzin et al.

(10) Patent No.: US 8,683,304 B2
(45) Date of Patent: *Mar. 25, 2014

(54) ERROR-CORRECTING CODE AND PROCESS FOR FAST READ-ERROR CORRECTION

(71) Applicant: Micron Technology, Inc., Boise, ID (US)

(72) Inventors: Marco Sforzin, Cernusco sul Naviglio (IT); Christophe Laurent, Agrate Brianza (IT); Paolo Amato, Pagazzano (IT); Sandro Bellini, Monza (IT); Marco Ferrari, Milan (IT); Alessandro Tomasoni, Lesmo (IT)

(73) Assignees: Micron Technology, Inc., Boise, ID (US); Politecnico di Milano, Milan (IT)

( * ) Notice: Subject to any disclaimer, the term of this patent is extended or adjusted under 35 U.S.C. 154(b) by 0 days.

This patent is subject to a terminal disclaimer.

(21) Appl. No.: 13/710,067

(22) Filed: Dec. 10, 2012

(65) Prior Publication Data

US 2013/0139039 A1     May 30, 2013

Related U.S. Application Data

(63) Continuation of application No. 12/612,935, filed on Nov. 5, 2009, now Pat. No. 8,332,731.

(51) Int. Cl.
*H03M 13/00*     (2006.01)

(52) U.S. Cl.
USPC .......................................................... 714/782

(58) Field of Classification Search
None
See application file for complete search history.

(56) References Cited

U.S. PATENT DOCUMENTS

| 4,556,977 | A | 12/1985 | Olderdissen et al. |
| 5,343,426 | A | 8/1994 | Cassidy et al. |
| 5,754,753 | A | 5/1998 | Smelser |
| 8,291,303 | B2 * | 10/2012 | Toda .............................. 714/782 |
| 2003/0028842 | A1 | 2/2003 | Katayama et al. |

* cited by examiner

*Primary Examiner* — Michael Maskulinski
(74) *Attorney, Agent, or Firm* — Knobbe Martens Olson & Bear LLP (57) ABSTRACT

Subject matter, for example, disclosed herein relates to an embodiment of a process, system, device, or article involving error correction codes. In a particular embodiment, an error-correcting device may comprise an input port to receive an error correcting code (ECC) based, at least in part, on contents of a memory array; a nonlinear computing block to process the ECC to provide a plurality of signals representing a non-linear portion of an error locator polynomial; and a linear computing block to process the ECC concurrently with processing the ECC to provide a plurality of signals representing the nonlinear portion of the error locator polynomial, to provide a plurality of signals representing a linear portion of the error locator polynomial.

21 Claims, 4 Drawing Sheets

ERROR-CORRECTING CODE AND PROCESS FOR FAST READ-ERROR CORRECTION

CROSS-REFERENCE TO RELATED APPLICATION

This application is a continuation application of U.S. application Ser. No. 12/612,935, filed Nov. 5, 2009, issued as U.S. Pat. No. 8,332,731 on Dec. 11, 2012, the entirety of which is incorporated by reference herein.

BACKGROUND

1. Field

Subject matter disclosed herein relates to error correction codes.

2. Information

In the last decade, for example, memory devices have continued to become denser. However, as memory cells become smaller, they tend to also become more prone to errors. Such may be the case for a number of nonvolatile memory technologies like NAND Flash Memories, NOR Flash Memories, and Phase Change Memories. In addition, error probability may increase for memories utilizing multi-level architecture to store information in a memory cell. Here, a voltage (or current) window may remain the same but the read margin may decrease because distribution levels may be relatively close together. Errors occurring during reading of a nonvolatile memory may result from storage charge loss, random telegraph signal effects, coupling effects, detrapping mechanisms, read disturb phenomena, and/or cosmic rays, just to name a few examples.

BRIEF DESCRIPTION OF THE FIGURES

Non-limiting and non-exhaustive embodiments will be described with reference to the following figures, wherein like reference numerals refer to like parts throughout the various figures unless otherwise specified.

DETAILED DESCRIPTION

Reference throughout this specification to "one embodiment" or "an embodiment" means that a particular feature, structure, or characteristic described in connection with the embodiment is included in at least one embodiment of claimed subject matter. Thus, the appearances of the phrase "in one embodiment" or "an embodiment" in various places throughout this specification are not necessarily all referring to the same embodiment. Furthermore, the particular features, structures, or characteristics may be combined in one or more embodiments.

Embodiments described herein include processes and/or electronic architecture involving an error correction code (ECC) to correct one or more errors while satisfying particular constraints that may be imposed by various applications. For example, applications involving execution-in-place (XiP) memories may use such an ECC process to reliably correct up to two errors in less than 10.0 ns. In addition to such a time constraint, a portion of an area of a memory device to implement such an ECC process may be maintained at a relatively low value. For example, such an area occupancy of circuitry related to an ECC process may be smaller than 5% of total die area of a memory device.

An ECC process may supplement user data with parity bits to store enough extra information for the user data to be reconstructed if one or more bits of the user data become corrupted. In a particular implementation, an ECC process may be based, at least in part, on parallel encoding and decoding techniques. Such techniques may involve a 2-bit error correcting binary Bose-Chaudhuri-Hocquenghem (BCH) code. A process using such a BCH code may include a BCH decoder that need not involve division operations in a Galois Field (GF), thus avoiding relatively lengthy electronic operations.

Herein, a string of user data supplemented with parity bits is called an ECC codeword. An ECC with codewords of length n, with k data bits, and which is able to correct t errors is denoted by a triplet (n, k, 2t+1). An ECC process may be configured based, at least in part, on a particular application being used. For example, an application may be characterized by an error correction capability (t), a data page dimension (k), a correction time (T), a silicon area occupation (A), and types of errors (e.g., random or burst). To describe a particular example, k may be 4 or 8 kilobits, T may be in the order of tens of microseconds, and t may range from 4 to 24 (i.e., based at least in part on k and on the number of stored bits per memory cell). To describe another particular example, for an XiP application k may be 128, 256, or 512 bits, and T may be in the order of several nanoseconds. Of course, such parameters are merely examples, and claimed subject matter is not so limited.

In an embodiment, latency may be a primary concern. Here, latency refers to a time lag between "reading" and "correcting" a string of user data. Operations described herein are configured to improve latency by reducing execution time. In the following, $T_X$, $T_A$, and $T_{3O}$ refer to operation time lengths for AND, XOR, and 3-input OR logic gates, respectively. Such logic gates may be used, for example, in an electronic circuit to implement processes and/or operations described herein.

A string of user data may comprise 256 bits, though such a number of bits is merely an example used herein to illustrate a particular embodiment. In this particular embodiment, operations involving a $GF(2^9)$ will be described. A BCH code may be shortened after being configured in the finite field GF(512), generated by $p(x)=x^9+x^4+1$. Elements $\alpha^j$ of the field may be represented in polynomial form, which may lead to relatively simple implementations of sums and more challenging implementations of multiplication operations.

Multiplication of a variable a by a constant $\alpha^j$ may be evaluated as a linear combination of the bits of a. Complexity may depend on j. With j=0, 1 ... 8, for example, there may be three addends for each bit of the result, hence the operation may take $2T_X$.

Multiplication of two variables, say c=ab, may be implemented by a technique that exploits different latencies for the two factors a and b. In an evaluation process, if a is available before b, then terms $a\alpha^j$ (j=0, 1 ... 8) may be evaluated. Next, the following summations from j=0 to j=m−1 may be carried out, multiplied by bits $b_j$:

$$c=ab=a*\Sigma b_j\alpha^j=\Sigma b_j(a\alpha^j).$$

Since operations involving multiplication by $a^j$ may take a relatively long time, b may be available at a time later than a. Final sums involving nine addends may take a time $4T_X$ if such addends were synchronous. As some are available in advance, a time $3T_X$ may be sufficient to complete the summation operation in a time $T_A+5T_X$ after a is available. An additional $T_X$ delay for b may then be tolerated with little or no time penalty.

As a result of asynchronism of different addends, a third variable d may be added to the product ab without additional delay and, moreover, at least some processing on variable d may be performed in parallel. For example, evaluating c=ab+$d^4$ may take $T_A+5T_X$ after a is available, including additional delays for b and d of up to $T_X$ and $2T_X$, respectively. Further, the square-multiplication $a^2b$ and $a^2b+d$ may have the same latency. Accordingly, products $a^i\alpha^j$ may involve different combinations of the bits of $\alpha$, but without a time penalty.

A special case of the operation $a^2b$ may include $a^3$, which may take a relatively short duration $T_A+4T_X$. Such a result may be achieved by separating linear and nonlinear parts of the following operation:

$$a^3=\Sigma a_i\alpha^{3i}+\Sigma_i\Sigma_j a_i a_j(\alpha^{2i+j}+\alpha^{i+2j}).$$

The "$\Sigma_i\Sigma_j a_i a_j(\alpha^{2i+j}\alpha^{i+2j})$" term may present a bottleneck, which may be at least partially alleviated by collecting partial sums before products. Such a separation may then allow addition of a second variable b without additional latency. Similar considerations and latency may hold for nonlinear powers such as $a^6$, while $a^2$ comprises a simple linear combination of the bits of a that may be processed in a time of $T_X$.

In an embodiment, a double error correcting BCH code in GF(512) may comprise the triplet BCH(511,493,5) associated with a generator polynomial:

$$g(x)=x^{18}+x^{15}+x^{12}+x^{10}+x^8+x^7+x^6+x^3+1.$$

Such a BCH code may be shortened to (274,256,5) in such a way that survived positions of the information bits minimize latency of syndrome evaluations and the number of operations involved in the syndrome evaluation:

$$S_1=\Sigma_n y_{in}\alpha^{in},$$

$$S_3=\Sigma_n y_{in}\alpha^{3in}.$$

The number of addends $y_{in}$ for bits of $S_1$ and $S_3$ may be kept below 128 (e.g., $2^7$), thus reducing the latency of the syndrome evaluation process to a time $7T_X$.

A monic locator polynomial (e.g., having a leading term with a coefficient of 1) may involve a division operation as follows:

$$\Gamma(x)=1+S_1x+(S_1^3+S_3)*x^2/S_1$$

Such a division may present relatively high demands in terms of latency. Regarding a process for finding roots of such a monic locator polynomial, the polynomial $\Gamma(x)=S_1+S_1^2x+(S_1^3+S_3)x^2$ may be equivalent as long as $S_1$ is not 0. The condition $S_1=0$ may denote either an absence of errors (if also $S_3=0$) or an error pattern that may not be correctable (if $S_3\neq 0$). Also, in the case of a single error, $(S_1^3+S_3=0)$ may be evaluated using $\Gamma(x)=S_1+S_1^2x+(S_1^3+S_3)$ $x^2$, for example. If a codeword includes a correctable error in position i, multiplying such an equation by $\alpha^{2i}$, results in:

$$S_1\alpha^{2i}+S_1^2\alpha^i+S_1^3S_3=0.$$

Such an expression may be particularly useful because $S_1^3+S_3$ may be a relatively critical evaluation in terms of latency, and is the last term to become available during a process to evaluate such a monic locator polynomial. Nine bits of $S_1\alpha^{2i}+S_1^2\alpha^i$ may comprise linear combinations of the bits of $S_1$, which may depend, at least in part, on the specific position i. In a particular implementation, there may be 256 different positions and nine (possibly) different linear combinations for each such position. Accordingly, there may be 511 non-null distinct linear combinations to be evaluated. Such a linear combination may also include a linear part of $S_1^3$. To optimize the speed of operations, the 256 terms may be evaluated in parallel. Bits that are determined to be errors may be flipped (e.g., "1" flips to "0" or "0" flips to "1"). Of course, such details of an ECC process are merely examples, and claimed subject matter is not so limited.

Figure 1:
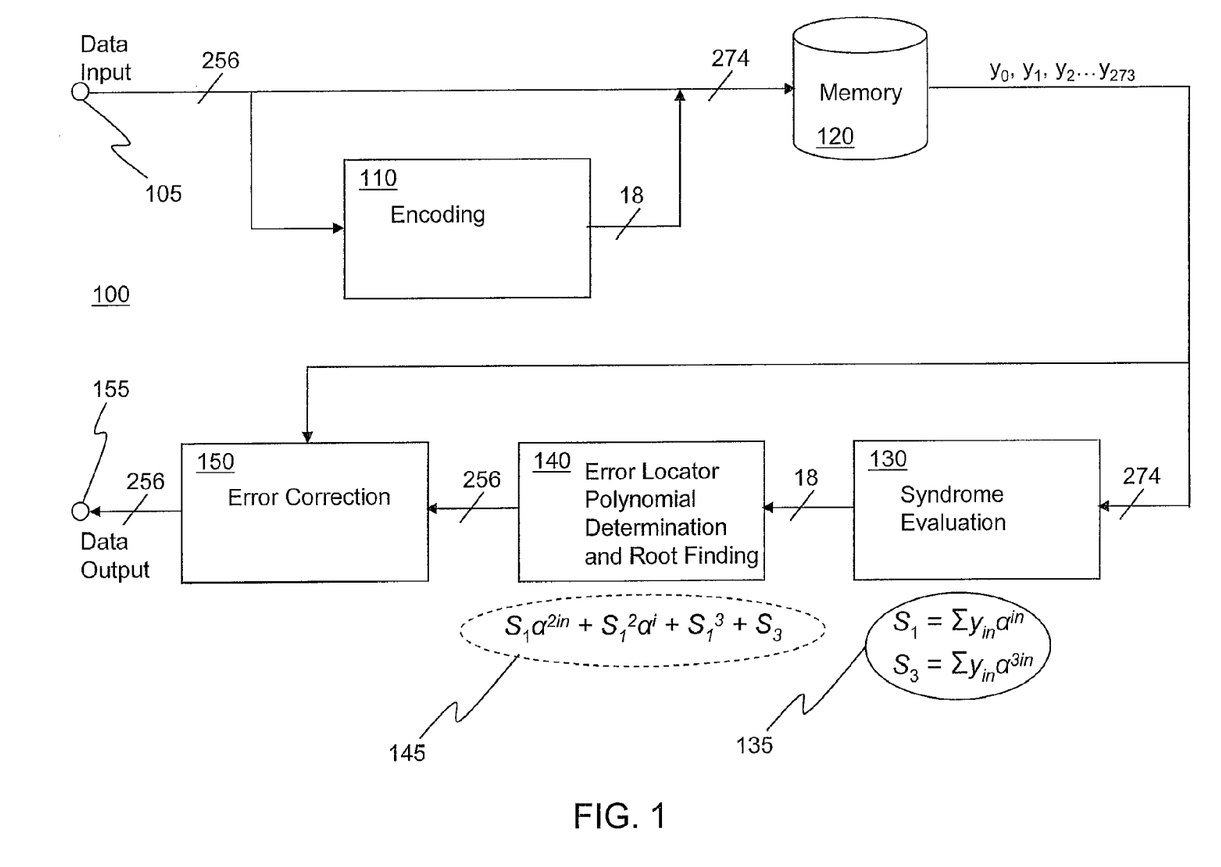
FIG. 1 is a schematic diagram of a system capable of carrying out an error correcting process, according to another embodiment.

FIG. 1 is a schematic diagram of a system 100 to carry out an error correcting process, according to an embodiment. User data, which may comprise data resulting from an application, as discussed below for example, may be presented at data input 105. As indicated above, such user data may comprise a bit string that is 256 bits, though such a number of bits is merely an example and claimed subject matter is not so limited (e.g., a general example may involve k user-data bits). At block 110, such user data may be supplemented and/or encoded with parity bits. As shown in a particular example of FIG. 1, user data may be encoded with eighteen parity bits, resulting in an ECC codeword of 274 bits (e.g., a general example may involve a codeword length of n and n-k parity check bits). At block 120, such a codeword (e.g., encoded user data bits) may be stored in a memory, such as an XiP memory for example. In keeping with notation used above, such an ECC codeword read from memory block 120 may comprise bits $y_0, y_1, y_2 \ldots y_{273}$ provided to block 130 for a syndrome evaluation, as described above. Such a syndrome evaluation may be governed, at least in part, by equations 135 shown in FIG. 1 and derived above. At block 140, polynomial 145 may be used in a process of determining an error locator polynomial and finding roots of such a polynomial, as described in detail below. Results of such a process 140 may provide a bit string that may be combined (e.g., logically) with the original user data bit string at block 150. Such a combination may then provide a corrected user data string at data output 155. Of course, such a process is merely an example, and claimed subject matter is not so limited.

Figure 2:
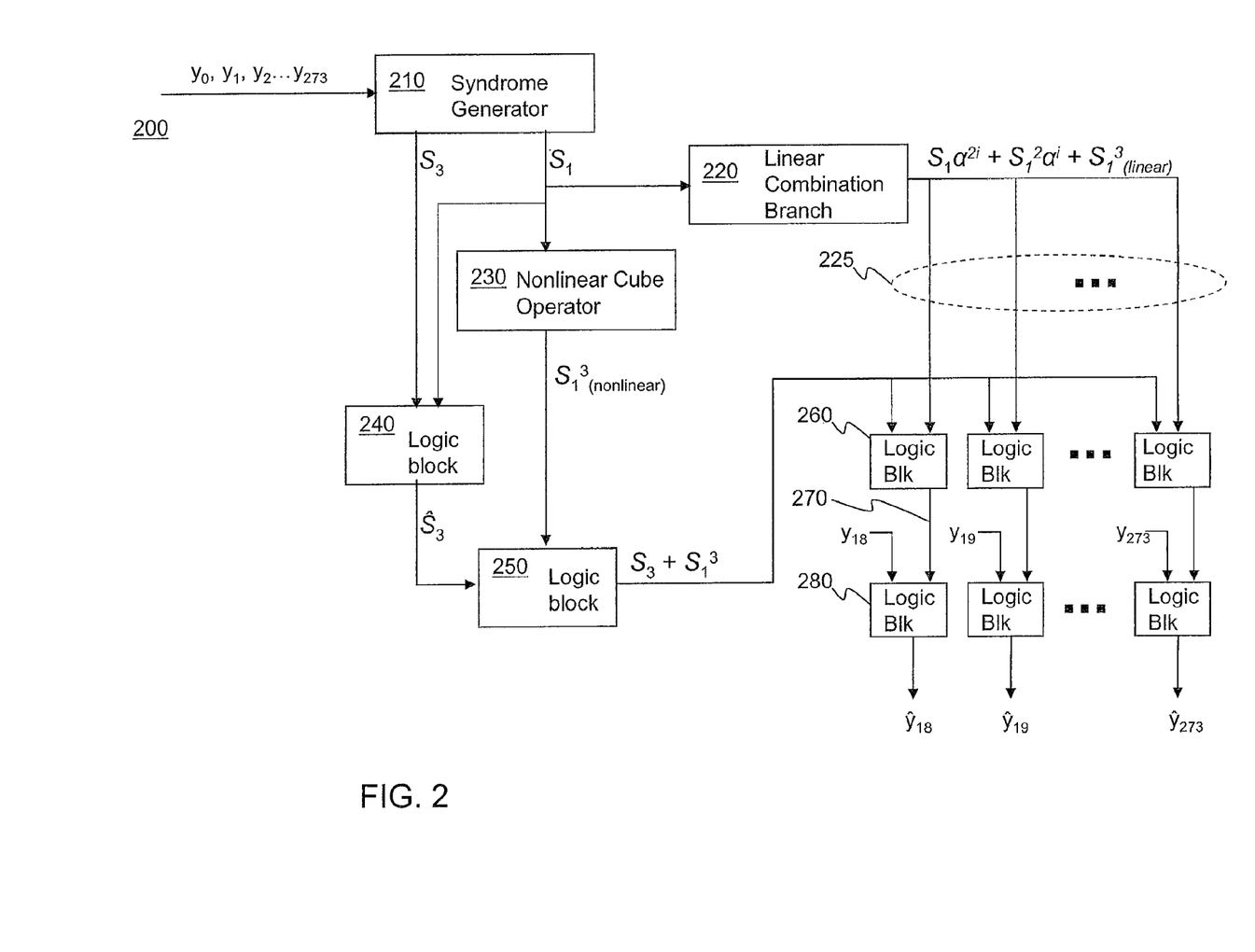
FIG. 2 is a schematic diagram of a system capable of carrying out an error correcting process, according to another embodiment.

FIG. 2 is a schematic diagram of an error correcting process 200, according to an embodiment. Such a process of error correction may be based, at least in part, on determining roots of the relation $$S_1\alpha^{2i}+S_1^2\alpha^i+S_1^3+S_30.$$

An ECC codeword comprising bits $y_0, y_1, y_2 \ldots y_{273}$ may be provided to syndrome generator 210. Such a codeword may include user bit portion $y_{18}, y_{19} \ldots y_{273}$ and parity bit portion $y_0, y_1 \ldots y_{17}$, for example (in other embodiments there may be no need to distinguish between user and parity data). Using such bits values, syndrome generator 210 may determine $S_1$ and $S_3$, using $S_1=\Sigma_n y_{in}\alpha^{in}$ and $S_3=\Sigma_n y_{in}\alpha^{in}$, as described above. $S_1$ may then be provided to a nonlinear computing block comprising nonlinear cube operator 230, which may result in evaluation of a nonlinear portion of $S_1^3$. Also, $S_1$ may be provided to a linear computing block comprising linear combination branch 220 to evaluate $S_1\alpha^{2i}+S_1^2\alpha^i$ and a linear portion of $S_1^3$. Such an evaluation may be performed by parallel circuit branches 225. As explained above for a particular implementation, there may be 256 different positions and nine different linear combinations of $S_1$ for each such position. Accordingly, there may be 511 non-null distinct linear combinations to be evaluated. Such a linear combination may also include a linear part of $S_1^3$.

Accordingly, the number of parallel circuit branches 225 account for such combinations, which may then be evaluated concurrently.

In a particular embodiment, syndrome generator 210 may provide $S_1$ and $S_3$ to logic block 240, which may comprise one or more logic operators and/or logic circuit elements, such as AND, XOR, and/or 3-input OR logic gates, just to name a few examples. In turn, logic block 240 may provide a result to logic block 250, which may logically combine such a result with a nonlinear portion of $S_1^3$ evaluated by nonlinear cube operator 230. Subsequently, results from logic block 250 and parallel circuit branches 225 may be logically combined at logic blocks 260, which may comprise one or more XOR and/or NOR logic gates, for example. Output 270 from logic blocks 260 may then be respectively combined, via logic blocks 280, with bits $y_{18}, y_{19}, y_{20} \ldots y_{273}$ of the original ECC codeword. Such a combination may result in an error corrected output $\hat{y}_{18}, \hat{y}_{19} \ldots y_{273}$ of the user bits $y_{18}, y_{19} \ldots y_{273}$.

Figure 3:
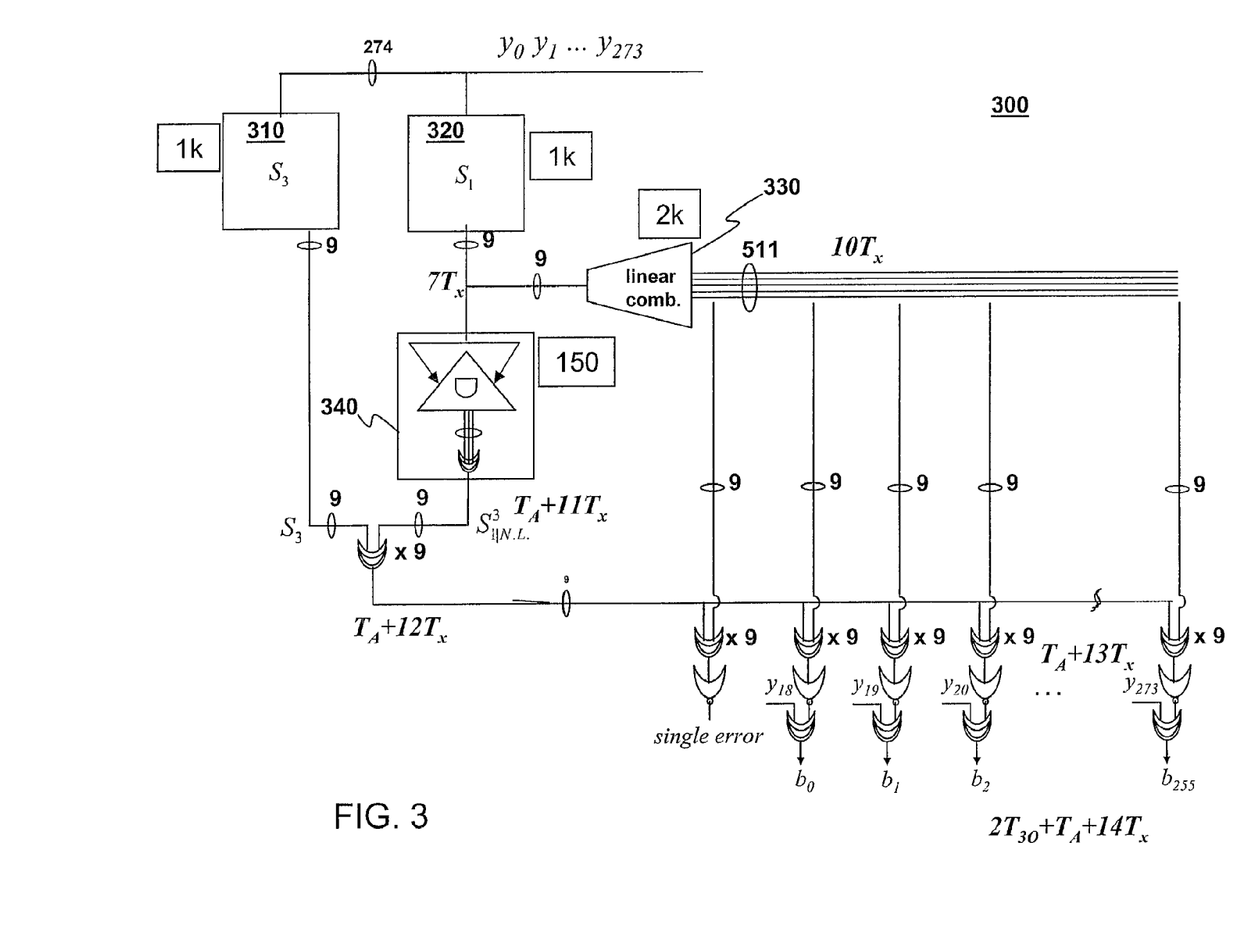
FIG. 3 is a schematic diagram of an error correcting decoder, according to an embodiment.

FIG. 3 is a schematic diagram of an error correcting decoder 300, according to an embodiment. Such a decoder is shown with values indicating latency and number of logic gates involved in a particular portion of the decoder, as described below. Here, such values are merely used to illustrate parameters that may be considered in evaluating and/or designing decoder architecture. In particular, latency associated with particular decoder components, such as logic gates or collections thereof, may be considered while designing a decoder to improve operating speed. Similarly, numbers of logic gates may be considered while determining area occupancy of a decoder on an integrated circuit (IC) on which such a decoder and/or memory device may reside. In any case, such latency and gate number parameters illustrated herein are merely examples, and claimed subject matter is not so limited.

Decoder 300 may follow an error-correcting process such as process 200 shown in FIG. 2, for example. An ECC codeword comprising bits $y_0, y_1, y_2 \ldots y_{273}$ may be provided to syndrome generators 310 and 320 to evaluate $S_1$ and $S_3$ based, at least in part, on evaluating $S_1 = \Sigma_n y_{in} \alpha^{in}$ and $S_3 = \Sigma_n y_{in} \alpha^{3in}$. As described above, such a codeword may include user bit portion $y_{18}, y_{19} \ldots y_{273}$ and parity bit portion $y_0, y_1 \ldots y_{17}$, for example. As indicated in FIG. 3, syndrome generators 310 and 320 may comprise approximately one thousand logic gates to carry out an evaluation of $S_1$ and $S_3$. Also, a latency of $7T_x$ may result from an evaluation of $S_1$. Herein, "approximately one thousand" may mean "of the order of one thousand", and such meaning may include numbers such as several hundred or several thousand. In other words, such a description is only intended to be illustrative, and numbers cited herein, unless otherwise indicated, are merely intended to provide rough estimates.

Continuing with FIG. 3, a nonlinear computing block comprising nonlinear cube operator 340, which may result in evaluation of a nonlinear portion of $S_1^3$, may involve about 150 logic gates and an added latency of $T_A + 4T_x$. Meanwhile, a linear computing block comprising linear combination branch 330 may involve about two thousand logic gates and an added latency of $3T_x$, and so on. Thus, it follows that a relatively critical path, in terms of latency, may be the evaluation of the non-linear portion of $S_1^3$ that requires $T_A + 4T_x$ after S1 is available. A final correction stage may require an addition of a constant (e.g., a term not depending on the info bit) to the variable term ($T_x$), a check operation of the sum being null ($2T_{3O}$), and a correction operation ($T_x$) for a total latency of approximately 10 ns ($T_A + 14T_x + 2T_{3O}$), for example. Such a relatively low time value for latency may be achieved by designing an error correction decoder according to embodiments described above.

As to area occupancy of decoder 300, the most demanding process stages may be the syndrome evaluations performed by syndrome generators 310 and 320 (approximately one thousand gates each), the linear combination operations of S1 performed by linear combination branch 330 (approximately two thousand gates), and the final correction stage (approximately three or four thousand gates), for a total area estimate of 0.09 mm². Such a relatively low area value for area occupancy may be achieved by designing an error correction decoder according to embodiments described above. Of course, such numbers are merely intended to be illustrative, and claimed subject matter is not so limited.

Figure 4:
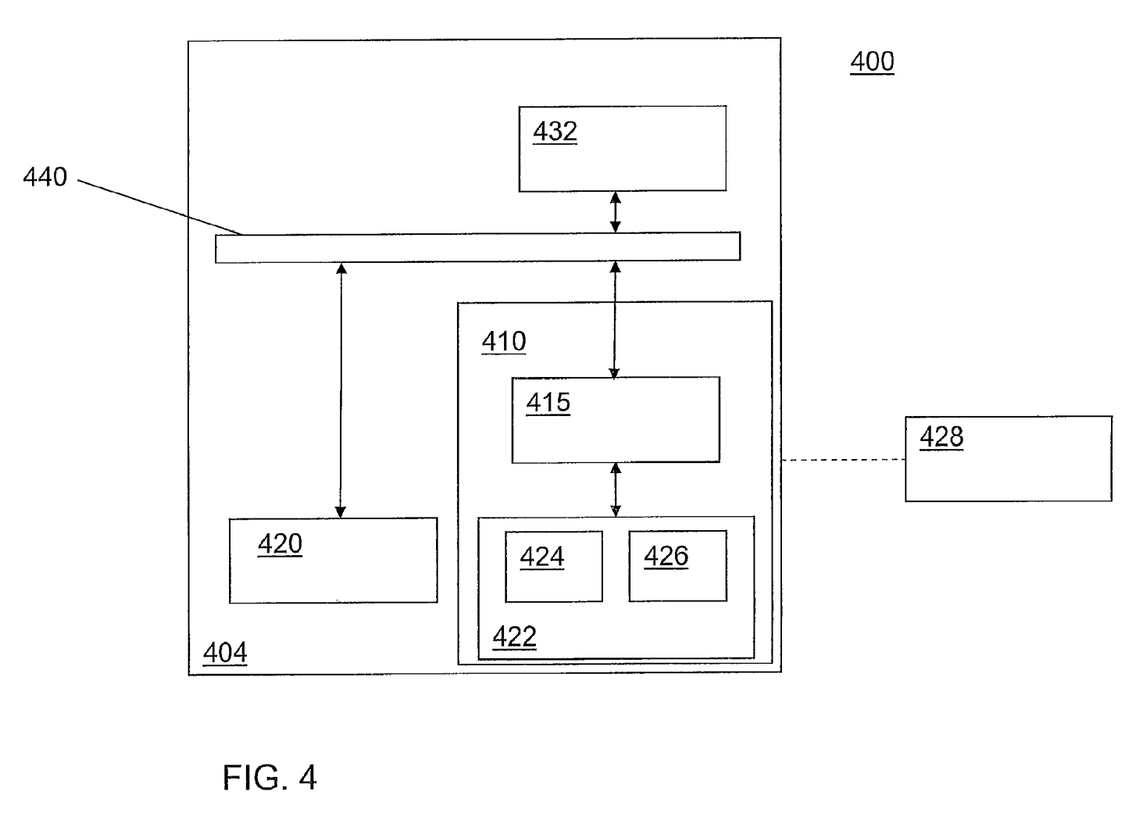
FIG. 4 is a schematic view of a computing system, according to an embodiment.

FIG. 4 is a schematic diagram illustrating an exemplary embodiment of a computing system 400 including a memory device 410. Such a computing device may comprise one or more processors, for example, to execute code to implement error correcting techniques described above. For example, memory device 410 may comprise a memory such as memory device 120 shown in FIG. 1. Such processors may implement user data encoding at block 110, and other operations that are also shown in FIG. 1, for example. A computing device 404 may be representative of any device, appliance, or machine that may be configurable to manage memory device 410. Memory device 410 may include a memory controller 415 and a memory 422. By way of example but not limitation, computing device 404 may include: one or more computing devices and/or platforms, such as, e.g., a desktop computer, a laptop computer, a workstation, a server device, or the like; one or more personal computing or communication devices or appliances, such as, e.g., a personal digital assistant, mobile communication device, or the like; a computing system and/or associated service provider capability, such as, e.g., a database or data storage service provider/system; and/or any combination thereof.

It is recognized that all or part of the various devices shown in system 400, and the processes and methods as further described herein, may be implemented using or otherwise including hardware, firmware, software, or any combination thereof. Thus, by way of example but not limitation, computing device 404 may include at least one processing unit 420 that is operatively coupled to memory 422 through a bus 440 and a host or memory controller 415. Processing unit 420 is representative of one or more circuits configurable to perform at least a portion of a data computing procedure or process. By way of example but not limitation, processing unit 420 may include one or more processors, controllers, microprocessors, microcontrollers, application specific integrated circuits, digital signal processors, programmable logic devices, field programmable gate arrays, and the like, or any combination thereof. Processing unit 420 may include an operating system configured to communicate with memory controller 415. Such an operating system may, for example, generate commands to be sent to memory controller 415 over bus 440. Such commands may include instructions to partition at least a portion of memory 422, to associate one or more attributes to particular partitions, and to program a particular partition based at least in part on the type of data to be programmed and stored, for example.

Memory 422 is representative of any data storage mechanism. Memory 422 may include, for example, a primary memory 424 and/or a secondary memory 426. Primary memory 424 may include, for example, a random access memory, read only memory, etc. While illustrated in this example as being separate from processing unit 420, it should be understood that all or part of primary memory 424 may be provided within or otherwise co-located/coupled with processing unit 420.

Secondary memory 426 may include, for example, the same or similar type of memory as primary memory and/or one or more data storage devices or systems, such as, for example, a disk drive, an optical disc drive, a tape drive, a solid state memory drive, etc. In certain implementations, secondary memory 426 may be operatively receptive of, or otherwise configurable to couple to, a computer-readable medium 428. Computer-readable medium 428 may include, for example, any medium that can carry and/or make accessible data, code, and/or instructions for one or more of the devices in system 400.

Computing device 404 may include, for example, an input/output 432. Input/output 432 is representative of one or more devices or features that may be configurable to accept or otherwise introduce human and/or machine inputs, and/or one or more devices or features that may be configurable to deliver or otherwise provide for human and/or machine outputs. By way of example but not limitation, input/output device 432 may include an operatively configured display, speaker, keyboard, mouse, trackball, touch screen, data port, etc.

In the above detailed description, numerous specific details are set forth to provide a thorough understanding of claimed subject matter. However, it will be understood by those skilled in the art that claimed subject matter may be practiced without these specific details. In other instances, methods, apparatuses, or systems that would be known by one of ordinary skill have not been described in detail so as not to obscure claimed subject matter.

Some portions of the detailed description above are presented in terms of algorithms or symbolic representations of operations on binary digital signals stored within a memory of a specific apparatus or special purpose computing device or platform. In the context of this particular specification, the term specific apparatus or the like includes a general purpose computer once it is programmed to perform particular operations pursuant to instructions from program software. Algorithmic descriptions or symbolic representations are examples of techniques used by those of ordinary skill in the signal processing or related arts to convey the substance of their work to others skilled in the art. An algorithm is here, and generally, is considered to be a self-consistent sequence of operations or similar signal processing leading to a desired result. In this context, operations or processing involve physical manipulation of physical quantities. Typically, although not necessarily, such quantities may take the form of electrical or magnetic signals capable of being stored, transferred, combined, compared or otherwise manipulated. It has proven convenient at times, principally for reasons of common usage, to refer to such signals as bits, data, values, elements, symbols, characters, terms, numbers, numerals, or the like. It should be understood, however, that all of these or similar terms are to be associated with appropriate physical quantities and are merely convenient labels. Unless specifically stated otherwise, as apparent from the following discussion, it is appreciated that throughout this specification discussions utilizing terms such as "processing," "computing," "calculating," "determining" or the like refer to actions or processes of a specific apparatus, such as a special purpose computer or a similar special purpose electronic computing device. In one example, such a special purpose computer or special purpose electronic computing device may comprise a general purpose computer programmed with instructions to perform one or more specific functions. In the context of this specification, therefore, a special purpose computer or a similar special purpose electronic computing device is capable of manipulating or transforming signals, typically represented as physical electronic or magnetic quantities within memories, registers, or other information storage devices, transmission devices, or display devices of the special purpose computer or similar special purpose electronic computing device.

The terms, "and," "and/or," and "or" as used herein may include a variety of meanings that will depend at least in part upon the context in which it is used. Typically, "and/or" as well as "or" if used to associate a list, such as A, B or C, is intended to mean A, B, and C, here used in the inclusive sense, as well as A, B or C, here used in the exclusive sense. Reference throughout this specification to "one embodiment" or "an embodiment" means that a particular feature, structure, or characteristic described in connection with the embodiment is included in at least one embodiment of claimed subject matter. Thus, the appearances of the phrase "in one embodiment" or "an embodiment" in various places throughout this specification are not necessarily all referring to the same embodiment. Furthermore, the particular features, structures, or characteristics may be combined in one or more embodiments. Embodiments described herein may include machines, devices, engines, or apparatuses that operate using digital signals. Such signals may comprise electronic signals, optical signals, electromagnetic signals, or any form of energy that provides information between locations.

While there has been illustrated and described what are presently considered to be example embodiments, it will be understood by those skilled in the art that various other modifications may be made, and equivalents may be substituted, without departing from claimed subject matter. Additionally, many modifications may be made to adapt a particular situation to the teachings of claimed subject matter without departing from the central concept described herein. Therefore, it is intended that claimed subject matter not be limited to the particular embodiments disclosed, but that such claimed subject matter may also include all embodiments falling within the scope of the appended claims, and equivalents thereof.

What is claimed is:

1. An apparatus comprising:
    a first circuit configured to receive a first syndrome as an input and to generate a non-linear portion of a cube of the first syndrome;
    a second circuit configured to receive the first syndrome as an input and to generate at least a linear portion of the cube of the first syndrome; and
    a plurality of parallel circuits configured to receive at least the linear portion of the cube of the first syndrome as an input and to generate a plurality of linear combinations of at least the linear portion of the cube of the first syndrome.

2. The apparatus of claim 1, further comprising:
    a third circuit configured to generate a first result based at least partly on the non-linear portion of the cube of the first syndrome and on a second syndrome;
    a plurality of first logic blocks configured to receive the plurality of linear combinations from the plurality of parallel circuits and to receive the first result as inputs, the plurality of logic blocks configured to combine the plurality of linear combinations and the first result to generate a plurality of second results; and
    a plurality of second logic blocks configured to receive the plurality of second results and uncorrected digits, the plurality of second logic blocks configured to combine the plurality of second results and the uncorrected digits to generate corrected digits.

3. The apparatus of claim 2, further comprising a fourth circuit configured to receive the first syndrome and the second syndrome as inputs and to generate a third result based on logical operations of the first syndrome and the second syndrome, and to provide the third result as an input to the third circuit.

4. The apparatus of claim 3, further comprising a fifth circuit configured to receive the uncorrected digits and to generate the first syndrome and the second syndrome.

5. The apparatus of claim 2, wherein the first syndrome and the second syndrome comprise syndromes for a Bose-Chaudhuri-Hocquenghem (BCH) code.

6. The apparatus of claim 1, wherein the second circuit and the plurality of parallel circuits are configured to operate concurrently with the first circuit.

7. The apparatus of claim 6, wherein a latency of the first circuit is larger than a latency of the second circuit such that a latency of the plurality of parallel circuits can be added with the latency of the second circuit without additional delay.

8. An electronically-implemented method of performing error correction, the method comprising:
receiving a first syndrome as an input;
electronically generating a non-linear portion of a cube of the first syndrome;
electronically generating at least a linear portion of the cube of the first syndrome separately from electronically generating the non-linear portion; and
generating a plurality of linear combinations of at least the linear portion of the cube of the first syndrome in parallel using a plurality of parallel circuits.

9. The method of claim 8, further comprising performing generating the at least the linear portion of the cube of the first syndrome and generating the plurality of linear combinations concurrently with performing generating the non-linear portion of a cube of the first syndrome.

10. An electronically implemented method of performing error correction, the method comprising:
receiving a first syndrome as an input;
electronically generating a non-linear portion of a cube of the first syndrome;
electronically generating at least a linear portion of the cube of the first syndrome separately from electronically generating the non-linear portion;
generating a plurality of linear combinations of at least the linear portion of the cube of the first syndrome using logic circuits;
generating a first result based at least partly on the non-linear portion of the cube of the first syndrome and on a second syndrome;
combining the plurality of linear combinations and the first result to generate a plurality of second results; and
combining the plurality of second results the uncorrected digits to generate corrected digits.

11. The method of claim 10, further comprising generating a third result based on logical operations of the first syndrome and the second syndrome.

12. The method of claim 11, further comprising generating the first syndrome and the second syndrome from the uncorrected digits.

13. The method of claim 10, wherein the first syndrome and the second syndrome comprise syndromes for a Bose-Chaudhuri-Hocquenghem (BCH) code.

14. An electronically-implemented method of performing error correction, the method comprising:
receiving a first syndrome as an input;
electronically generating a non-linear portion of a cube of the first syndrome;
electronically generating at least a linear portion of the cube of the first syndrome separately from electronically generating the non-linear portion;
generating a plurality of linear combinations of at least the linear portion of the cube of the first syndrome using logic circuits; and
performing generating the at least the linear portion of the cube of the first syndrome and generating the plurality of linear combinations concurrently with performing generating the non-linear portion of a cube of the first syndrome;
wherein a latency associated with performing generating the non-linear portion of a cube of the first syndrome is larger than a latency associated with performing generating the at least the linear portion of the cube of the first syndrome such that generating the plurality of linear combinations can be performed without additional delay.

15. A system comprising:
a processing element configured to issue at least one of a read operation or a write operation;
a memory device comprising:
a physical nonvolatile memory; and
a processor comprising:
a first circuit configured to receive a first syndrome as an input and to generate a non-linear portion of a cube of the first syndrome;
a second circuit configured to receive the first syndrome as an input and to generate at least a linear portion of the cube of the first syndrome; and
a plurality of parallel circuits configured to receive at least the linear portion of the cube of the first syndrome as an input and to generate a plurality of linear combinations of at least the linear portion of the cube of the first syndrome;
a bus configured to carry information associated with the at least one of the read operation or the write operation.

16. The system of claim 15, wherein the processor further comprises:
a third circuit configured to generate a first result based at least partly on the non-linear portion of the cube of the first syndrome and on a second syndrome;
a plurality of first logic blocks configured to receive the plurality of linear combinations from the plurality of parallel circuits and to receive the first result as inputs, the plurality of logic blocks configured to combine the plurality of linear combinations and the first result to generate a plurality of second results; and
a plurality of second logic blocks configured to receive the plurality of second results and uncorrected digits, the plurality of second logic blocks configured to combine the plurality of second results and the uncorrected digits to generate corrected digits.

17. The system of claim 16, wherein the processor further comprises a fourth circuit configured to receive the first syndrome and the second syndrome as inputs and to generate a third result based on logical operations of the first syndrome and the second syndrome, and to provide the third result as an input to the third circuit.

18. The system of claim 17, wherein the processor further comprises a fifth circuit configured to receive the uncorrected digits and to generate the first syndrome and the second syndrome.

19. The system of claim 16, wherein the first syndrome and the second syndrome comprise syndromes for a Bose-Chaudhuri-Hocquenghem (BCH) code.

20. The system of claim 15, wherein the second circuit and the plurality of parallel circuits are configured to operate concurrently with the first circuit, wherein a latency of the first circuit is larger than a latency of the second circuit such that a latency of the plurality of parallel circuits can be added with the latency of the second circuit without additional delay.

21. An error-correcting device comprising:
  an input port to receive an error correcting code (ECC) based, at least in part, on contents of a memory array;
  a nonlinear computing block to process said ECC to provide a plurality of signals representing a nonlinear portion of an error locator polynomial;
  a linear computing block to process said ECC concurrently with processing said ECC to provide a plurality of signals representing said nonlinear portion of said error locator polynomial, to provide a plurality of signals representing a linear portion of said error locator polynomial; and
  a linear combination circuit to process said plurality of signals representing said linear portion of said error locator polynomial concurrently with said process to provide said plurality of signals representing said nonlinear portion, wherein said linear combination circuit comprises at most $(2^m-1)$ parallel signal lines electronically coupled to k parallel word branches of width m, wherein k comprises a number of bits to be corrected.

\* \* \* \* \*

UNITED STATES PATENT AND TRADEMARK OFFICE
CERTIFICATE OF CORRECTION

| | | |
|---|---|---|
| PATENT NO. | : 8,683,304 B2 | Page 1 of 1 |
| APPLICATION NO. | : 13/710067 | |
| DATED | : March 25, 2014 | |
| INVENTOR(S) | : Marco Sforzin et al. | |

It is certified that error appears in the above-identified patent and that said Letters Patent is hereby corrected as shown below:

In the Claims

In column 9, line 52, in claim 10, after "results" insert -- and --.

Signed and Sealed this
Twenty-ninth Day of July, 2014

Michelle K. Lee
*Deputy Director of the United States Patent and Trademark Office*